United States Patent [19]

Hong

[11] Patent Number: 5,554,551
[45] Date of Patent: Sep. 10, 1996

[54] METHOD OF MANUFACTURE OF AN EEPROM CELL WITH SELF-ALIGNED THIN DIELECTRIC AREA

[75] Inventor: Gary Hong, Hsin-Chu, Taiwan

[73] Assignee: United Microelectronics Corporation, Hsin-Chu, Taiwan

[21] Appl. No.: 344,005

[22] Filed: Nov. 23, 1994

[51] Int. Cl.⁶ .................................................. H01L 21/8247
[52] U.S. Cl. ............................................. 437/43; 437/984
[58] Field of Search .................................. 437/43, 48, 52, 437/984

[56] References Cited

U.S. PATENT DOCUMENTS

| | | | |
|---|---|---|---|
| 5,267,195 | 11/1993 | Kodama | 365/185 |
| 5,273,923 | 12/1993 | Chang et al. | 437/43 |
| 5,371,027 | 12/1994 | Walker et al. | 437/43 |
| 5,424,233 | 6/1995 | Yang et al. | 437/43 |
| 5,427,970 | 6/1995 | Hsue et al. | 437/43 |
| 5,460,991 | 10/1995 | Hong | 437/43 |

*Primary Examiner*—George Fourson
*Assistant Examiner*—Richard A. Booth
*Attorney, Agent, or Firm*—William H. Wright

[57] ABSTRACT

An EEPROM cell is made by forming a first dielectric layer on a substrate, forming a tunnel mask with an tunnel opening used for etching the dielectric layer to form a tunnel window, doping a region of the substrate through the tunnel window and stripping the tunnel mask. A spacer frame is made about the perithery of the window over the first doped region of the substrate. A second dielectric layer is formed over the first doped region within the spacer frame which is then removed. Tunnel oxide is deposited on the exposed surface of the first doped region, a floating gate layer is deposited, mask and etched. The mask is stripped Ions are implanted into buried N+ source/drain regions through exposed surfaces of the gate oxide near the floating gate. A blanket interconductor layer covers the device. A control gate layer is deposited, mask and etched. The control gate mask is then removed.

21 Claims, 6 Drawing Sheets

METHOD OF MANUFACTURE OF AN EEPROM CELL WITH SELF-ALIGNED THIN DIELECTRIC AREA

BACKGROUND OF THE INVENTION

1. Field of the Invention

This invention relates to semiconductor memories and more particularly to EEPROM cells and the method of manufacture thereof.

2. Description of Related Art

Figure 1:
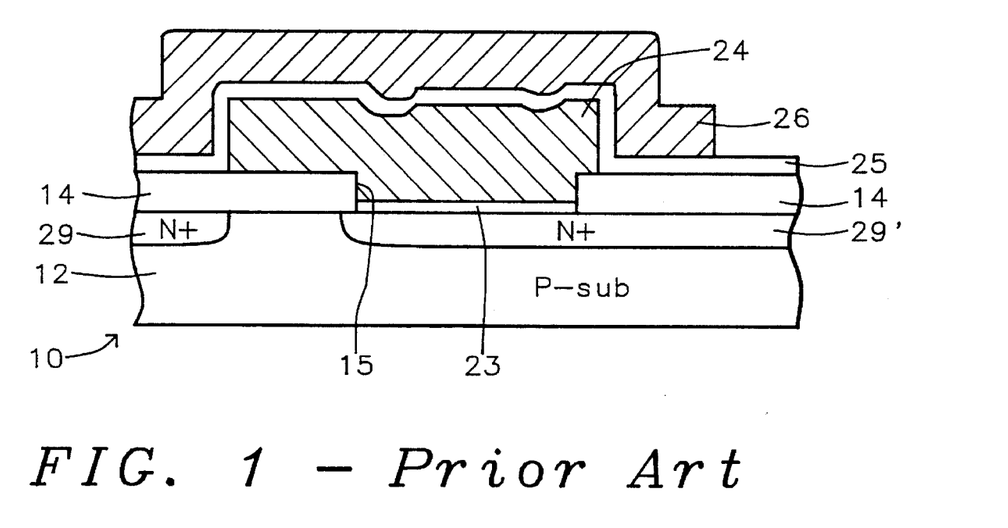
FIG. 1 shows a fragmentary sectional view of a prior art EEPROM cell.

Referring to FIG. 1, a fragmentary sectional view of a prior art EEPROM cell 10 is shown. Cell 10 includes a P-substrate 12 with two spaced apart regions 29 and 29' in the upper surface of substrate 12. The substrate 12 and N+ regions 29 and 29' are covered for the most part with a thin film gate oxide (silicon dioxide) layer 14. Within the gate oxide layer 14 is formed a tunnel oxide window 15 through thin film gate oxide layer 14. The tunnel oxide window 15 is located above the N+ region 29' on the right of device 10. The window 15 is only partially filled with a (silicon dioxide) thin film tunnel oxide layer 23 substantially thinner than the gate oxide layer 14. A polysilicon 1 floating gate 24 is formed above and in direct contact with the gate oxide layer 14 completely covering tunnel oxide window 15 and extending over thin tunnel oxide layer 23. Above the floating gate 24 is a thin ONO three layer dielectric thin film 25. Above the ONO 25 is formed a blanket polysilicon 2 control gate (word line) layer 26. The control gate (word line) layer 26 also overlies (traversing) the floating gate 26, as well.

The problem with the device of FIG. 1 is a relatively large tunnel oxide area 23 within tunnel oxide window 15. The minimum tunnel oxide area in such a conventional cell is limited by optical resolution of the photolithographic process employed in manufacture. A smaller tunnel oxide area is needed to provide an improved coupling ratio for the cell with higher reliability and higher yield.

U.S. Pat. No. 5,273,923 of Chang et al for "Process for Fabricating an EEPROM Cell Having a Tunnel Opening which Overlaps Field Isolation Regions" shows a process for forming a tunnel opening in an EEPROM overlapping the field oxide region employing a patch region to reduce floating gate-to-substrate capacitance to produce a higher capacitance coupling ratio to improve device performance. At Col. 6, lines 14–24 it is stated "the tunnel area . . . is defined by the overlap of tunnel opening 28 and active area 12, the minimum tunnel area will be determined by the smallest dimension of the tunnel opening and the smallest dimension of the active region. . . . Accordingly tunnel area adjustments are made by modifying the dimensions of either the tunnel opening, the active region, or both." A semiconductor substrate having an active region is bounded by a field isolation region, the active region having a tunnel implant region formed therein and having an overlying gate dielectric layer. Resist material is deposited on the substrate. The resist material is then patterned to form a tunnel opening which exposes a portion of the field isolation region and the gate dielectric overlying a portion of the active region. The active region is then doped within the tunnel opening to form a patch region. Portions of the field isolation region and the gate dielectric region exposed by the tunnel opening are then etched such that the active region of the semiconductor substrate within the tunnel opening is exposed. Then a tunnel dielectric is formed on the exposed portions of the active region. Next, an electrode is formed overlying the tunnel dielectric. Alternatively, as stated at Col. 7, line 29 and following, rather than forming a patch implant, the implant step used to form the tunnel implant can be adjusted to provide sufficient out-diffusion of the tunnel implant region. Since the tunnel area is defined by the overlap of the tunnel opening and the active area, it is still determined by the photolithography alignment (overlap) of these two layers, which photolithography alignment is a problem.

U.S. Pat. No. 5,267,195 of Kodama for "Semiconductor Non-volatile Memory Device" shows a process for forming a tunnel opening in a FLOTOX structure wherein it is under the floating gate extension.

SUMMARY OF THE INVENTION

An object of this invention is to provide an EEPROM cell with a smaller tunnel oxide area formed by a self-aligned method.

A further object is that the coupling ratio is improved for the cell providing higher reliability and higher yield.

In accordance with this invention, a method if provided for fabricating an MOSFET device on a lightly doped semiconductor substrate comprises forming a first dielectric layer on the substrate, forming a tunnel mask with an tunnel opening therein, etching through the mask to form a tunnel window in the first dielectric layer, doping a first doped region of the substrate through the tunnel window, stripping the tunnel mask, forming a spacer frame about the periphery of the window over the first doped region of the substrate, forming a second dielectric layer over the first doped region within the spacer frame, removing the spacer frame from the substrate, forming a tunnel oxide layer over the exposed surface of the first doped region of the substrate, forming a blanket deposit of a doped floating gate layer over the device, forming a floating gate mask over the floating gate layer and etching to shape the floating gate layer into a floating gate and stripping the mask, ion implanting dopant into buried N+ source/drain regions in the substrate through exposed surfaces of the gate oxide adjacent to the floating gate, forming a blanket interconductor layer over the device, forming a blanket control gate layer of a doped material over the interconductor dielectric layer, forming a control gate mask on the device, patterning the control gate layer by etching away portions of the control gate layer unprotected by the control gate mask, and removal of the control gate mask.

Preferably, spacers have a thickness of about 2000Å;

the spacers are formed from silicon nitride;

the floating gate comprises a polysilicon layer having a thickness within a range between about 1000Å and about 4000Å;

the control gate layer comprises a doped layer of a material selected from polysilicon and polycide having a thickness within a range between 2000Å and about 5000ÅA;

the first doped region is doped with an N+ ion selected from arsenic and phosphorus at an energy within a range between about 50 keV and about 100 keV implanted with a dose within a range between about $1\times10^{14}/cm^2$ and about $8\times10^{14}/cm^2$;

the second dielectric layer comprises silicon dioxide;

the second dielectric layer has a thickness within a range between about 200Å and about 500Å;

the tunnel oxide has a thickness within a range between about 200Å and about 500Å; and the second polysilicon layer has a thickness within a range between about 2000Å and about 5000Å.

BRIEF DESCRIPTION OF THE DRAWINGS

The foregoing and other aspects and advantages of this invention are explained and described below with reference to the accompanying drawings, in which.

DESCRIPTION OF THE PREFERRED EMBODIMENT

This invention provides a structure and a process sequence for producing a high-density, flash EEPROM memory device.

Figure 2A:
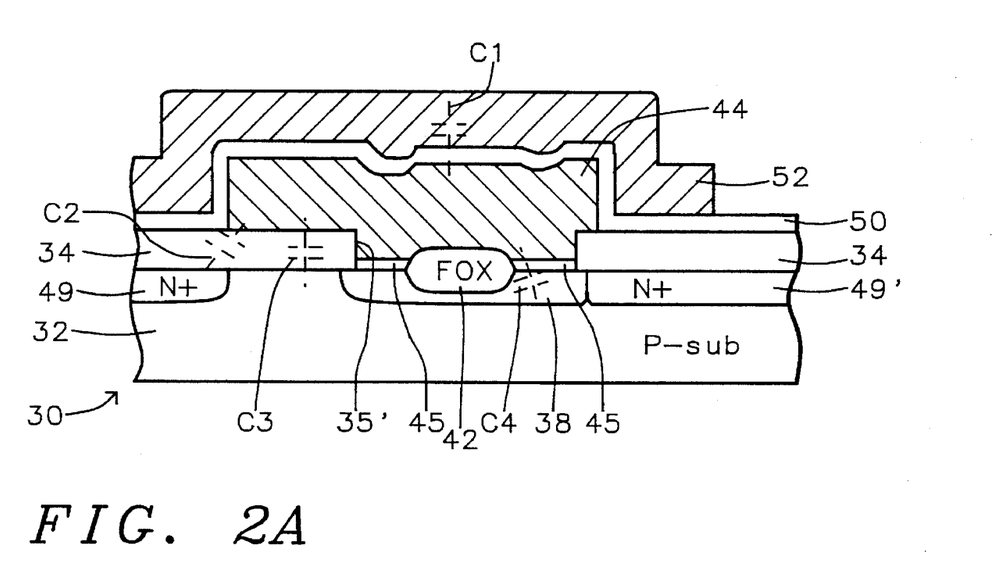
FIG. 2A shows a cross-sectional view of a fragment of an EEPROM device made in accordance with this invention.

FIG. 2A shows a cross-sectional view of a fragment of an EEPROM device 30 made in accordance with this invention. Device 30 includes a P- substrate 32 with several N+ regions 49 and 49' formed in substrate 32. Above the surface of substrate 32 is a gate oxide layer 34 with a window 35' therein which is filled with the combination of a tunnel oxide film 45 and a central thick oxide region 42 formed within the inner portion of tunnel oxide film 45 in window 35' and in an N+ region 38 which lies below window 35'. Formed above the tunnel oxide film 45 and the thick oxide region 42 (extending across tunnel oxide window 35') is polysilicon 1 floating gate 44. The floating gate 44 is covered with an ONO dielectric thin film 50. A word line (control gate) 52 is formed over ONO thin film 50. Capacitors C1, C2, C3, and C4 are shown in phantom to indicate the capacitive elements inherent in the structure shown in FIG. 2A.

Figure 2B:
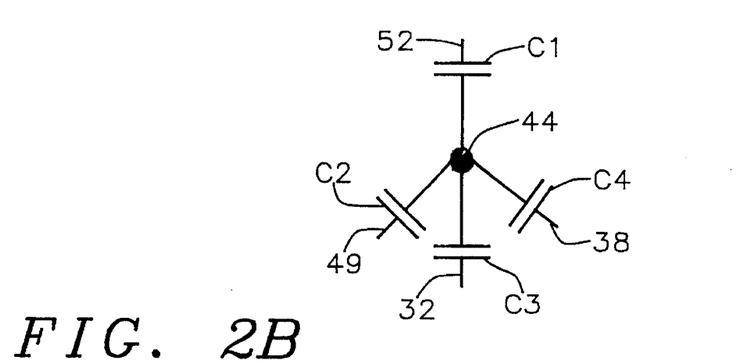
FIG. 2B shows an equivalent circuit of the capacitors formed by the capacitive values between floating gate electrode and other elements of the EEPROM device in accordance with this invention.

FIG. 2B shows an equivalent circuit of the capacitors C1, C2, C3, and C4 formed by the capacitive values between floating gate electrode 44 and other elements of device 30. Electrode 44 is connected through capacitor C1 to control gate 52, through capacitor C2 to N+ region 49, through capacitor C3 to P-substrate 32, and through capacitor C4 to N+ doped region 38.

Figure 3A:
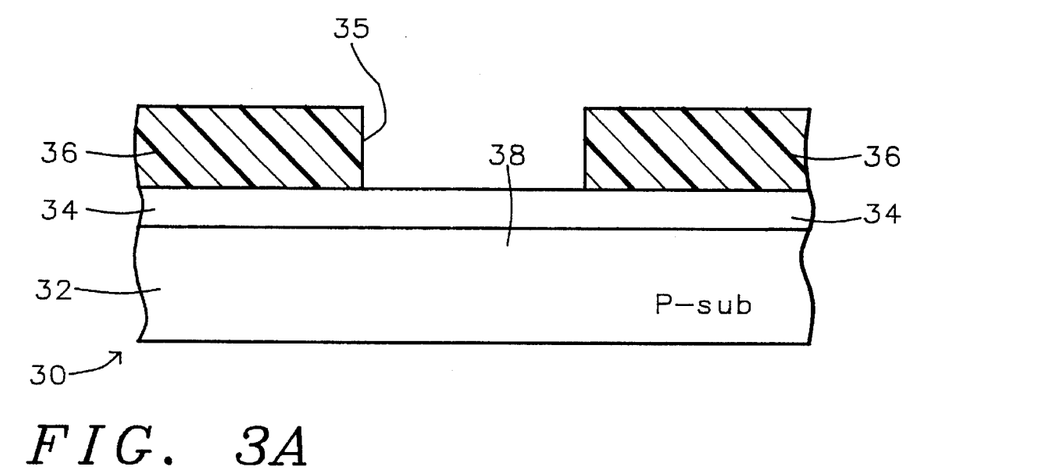
FIG. 3A shows a cross-sectional view of a fragment of a device made in accordance with this invention in the early stages of manufacture with a gate oxide layer and a mask thereon.

FIG. 3A shows a cross-sectional view of a fragment of a device 30 made in accordance with this invention in the early stages of manufacture.

PROCESS

Front End Process

In the early stages of fabrication in accordance with the method of this invention a P- doped silicon substrate 32 is produced by a conventional doping process.

Gate Oxidation

By the conventional process of gate oxidation the substrate 32 is covered with a blanket of a first dielectric layer (silicon dioxide) layer 34 having a preferred thickness within a range between about 200Å and about 500Å in accordance with a process well known by those skilled in the art. The process of growing the gate oxide is thermal oxidation.

Tunnel Window Masking

Then a photoresist mask structure 36 is formed over the gate oxide layer 34 with an tunnel window mask opening 35 therein.

Gate Oxide Etch

Figure 3B:
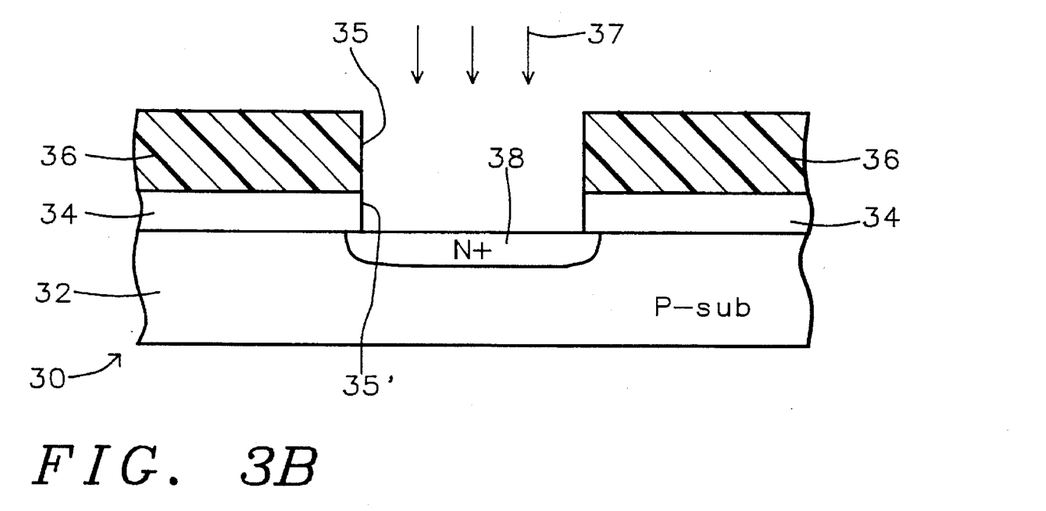
FIG. 3B shows the product of FIG. 3A after the gate oxide layer has been etched through a tunnel window opening in the mask and an N+ ion implant through the tunnel window opening has been made.

Referring to FIG. 3B, the product of FIG. 3A is shown after the layer 34 has been etched through opening 35 in mask 36. The result of the process of etching layer 34 is the formation of a tunnel window 35' which extends down through gate oxide layer 34.

N+ Region Ion Implant Through Tunnel Window

Then N+ dopant 37 is implanted through tunnel window 35' down below the exposed surface of P- substrate 32 to form therein an N+ region 38 below the tunnel window 35' into substrate 32. Preferably, the implantation of arsenic (As) or phosphorus (P) ions 37 is performed with an energy of between about 50 keV and about 100 keV. The dose of As ions 37 is within the range of doses between about $1\times10^{14}$/cm$^2$ and about $8\times10^{14}$/cm$^2$.

Resist Strip

Figure 3C:
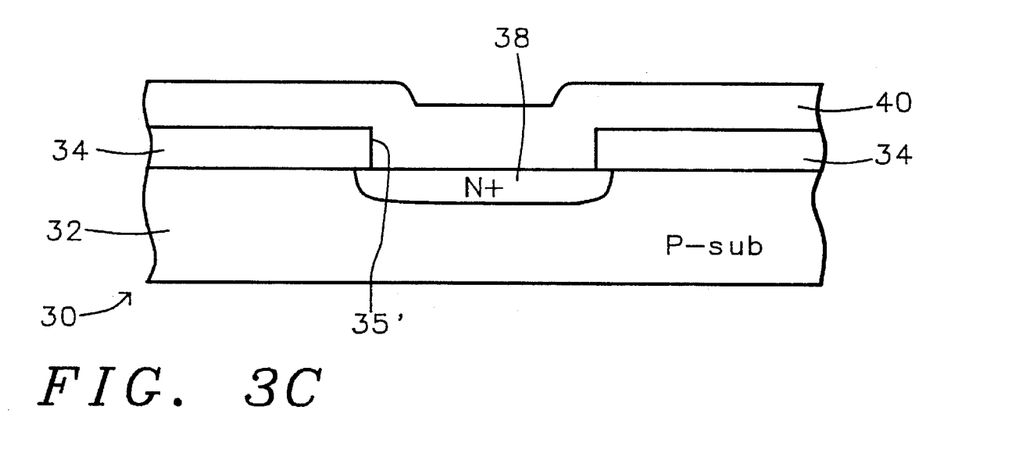
FIG. 3C shows the product of FIG. 3B after and after the mask has been stripped.

Referring to FIG. 3C, after completion of the ion implant through window 35 in FIG. 3B, photoresist mask 36 has been stripped in a conventional manner.

Silicon Nitride

Referring again to FIG. 3C, a blanket thin film comprising a silicon nitride (Si$_3$N$_4$) spacer layer 40 has been deposited on device 30 to a thickness of layer 40, which can be within the range between about 500Å and about 3,000Å, by a conventional CVD process. Later, the silicon nitride layer 40 is used to form spacer structures 40 as described below in connection with FIG. 3D.

Anisotropic Etch Back

Figure 3D:
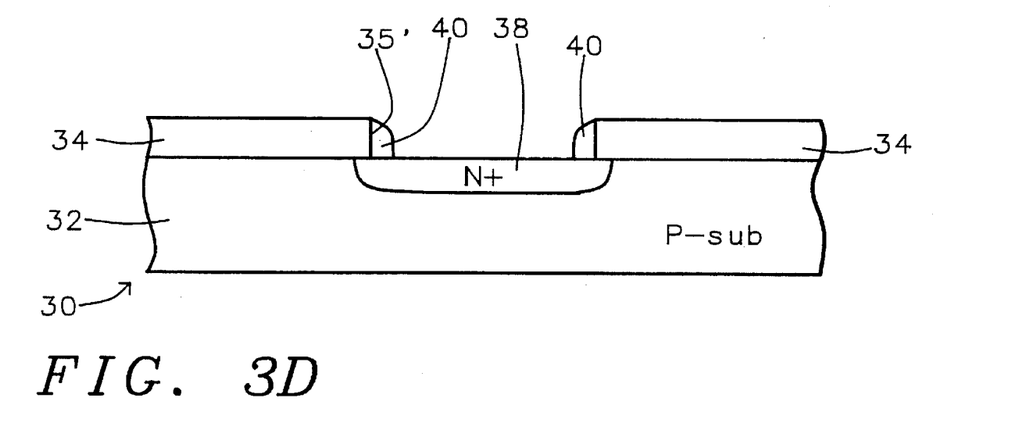
FIG. 3D shows the device of FIG. 3C after formation of spacer structures formed from silicon nitride layer around the edge of the tunnel window, used to determine the perimeter of a thick oxide region formed, as shown in FIG. 3E.

FIG. 3D shows spacer structures 40 formed from silicon nitride layer 40 by means of an anisotropic plasma etching process to form spacers 40 around the edge of tunnel window 35'. Spacers 40, which frame the tunnel oxide window 35', are used to determine the perimeter of a thick oxide region 42 to be formed, as shown in FIG. 3E and described therein.

Oxidation of Exposed Surface of Tunnel N+ Region

Figure 3E:
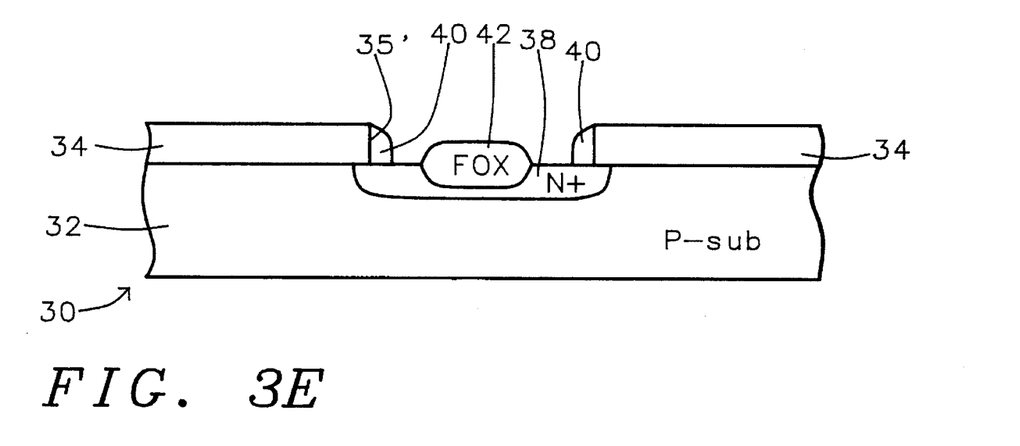
FIG. 3E shows the device of FIG. 3D after the portion of the N+ region of device exposed through the window framed with spacers is oxidized forming a thick oxide region.

Referring to FIG. 3E, the portion of N+ region 38 of device 30 exposed through window 35' framed with spacers 40 is oxidized forming a thick oxide region 42, which has thickness within a range between about 200Å and about 500Å (roughly equal to the thickness of the gate oxide layer 34) between the spacers 40. The process employed to form the region 42 comprises a conventional thermal oxidation process, e.g. exposure to oxygen O$_2$ gas at a temperature of about 900° C. for about 30 minutes.

Removal of Silicon Nitride Spacers

Figure 3F:
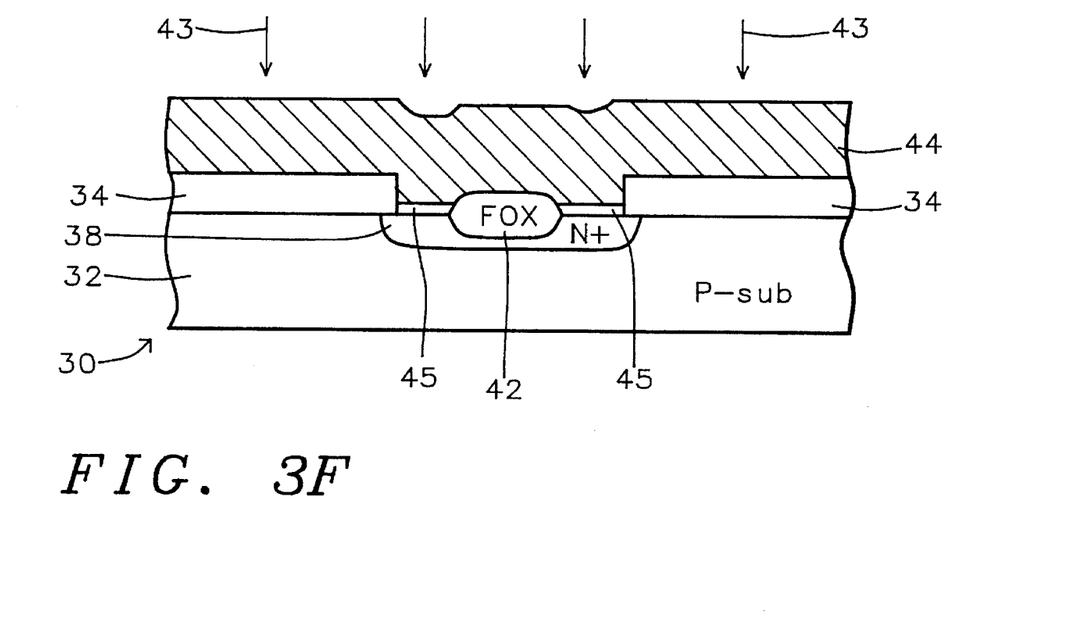
FIG. 3F shows the device of FIG. 3E after several steps have been performed including etching away the spacers, formation of a tunnel oxide layer, deposition and doping of a blanket, floating gate, polysilicon 1 layer is deposited to a possible maximum range of thicknesses.

FIG. 3F shows the device of FIG. 3E after several steps have been performed including etching away the spacers 40. Spacers 40 were etched away by etching with phosphoric acid (H$_3$PO$_4$), in a wet etch.

Formation of Tunnel Oxide Thin Film

Next, a thin tunnel oxide layer 45 having a thickness within a range between about 50Å and about 100Å is formed over the surface of N+ region 38 newly exposed by the removal of spacers 40. The preferred process for growing the tunnel oxide layer 45 is thermal oxidation in dry O$_2$ and N$_2$ (e.g. 850° C. for 10 minutes.)

Floating Gate Deposition and Doping

Then, a blanket, floating gate, polysilicon 1 layer 44 is deposited to a possible maximum range of thicknesses between about 1,000Å and about 4,000Å by the conventional LPCVD (low pressure chemical vapor deposition) process.

Subsequently, the polysilicon 1 layer 44 is doped in a conventional blanket application of dopant of phosphoryl chloride (POCl$_3$) at 900° C. for 20 minutes or by ion implantation. Alternatively, doping can be accomplished in a quite conventional manner, well known to those skilled in the art, with arsenic ions 43 which can be ion implanted with a dose within a range between about $1\times10^{14}$/cm$^2$ and about $5\times10^{15}$/cm$^2$ within a range of energies between about 30 keV and about 100 keV.

Masking and Etching Floating Gate

Figure 3G:
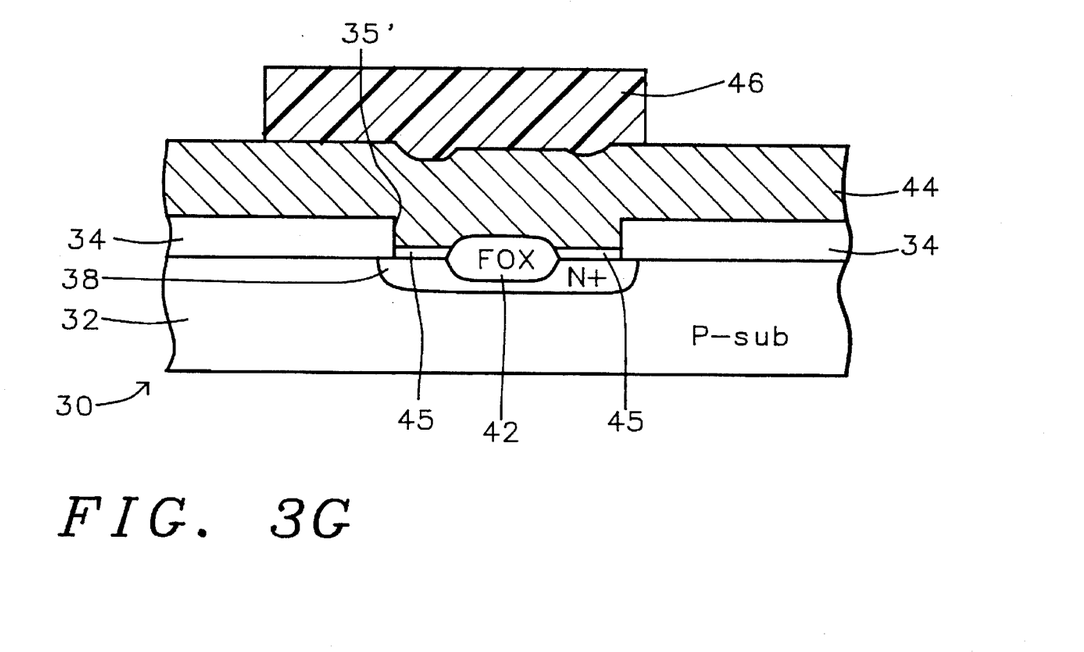
FIG. 3G shows the device of FIG. 3F after masking the floating gate layer with a patterned mask.
Figure 3H:
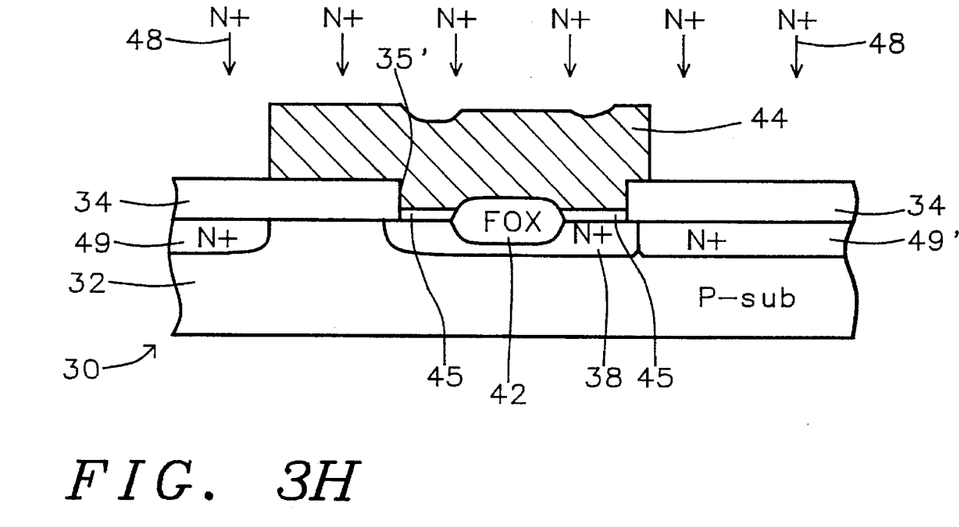
FIG. 3H shows the device of FIG. 3F the polysilicon 1 layer has been etched to form the floating gate as shaped by the mask, and ion implantation of source/drain regions.

Referring to FIG. 3G, the device of FIG. 3F is shown after a photoresist mask 46 was formed over the layer 44 and mask 46 was patterned into the shape of a floating gate 44 as seen in FIG. 3H.

Next, as shown in FIG. 3H, the polysilicon 1 layer 44 has been etched using a conventional etchant to form the floating gate 44 as shaped by mask 46.

N+ Source/Drain Ion Implant

Then N+ S/D (source/drain) Arsenic (As) dopant 48 is implanted into regions 49, 49' below the exposed surfaces of the P-substrate 32. The implantation of As ions 48 is performed with a range of energies between about 50 keV and about 80 keV. A range of doses of As ions 48 between about $1\times10^{15}$/cm$^2$ and about $5\times10^{15}$/cm$^2$ is possible.

Interpolysilicon Dielectric)

Figure 3I:
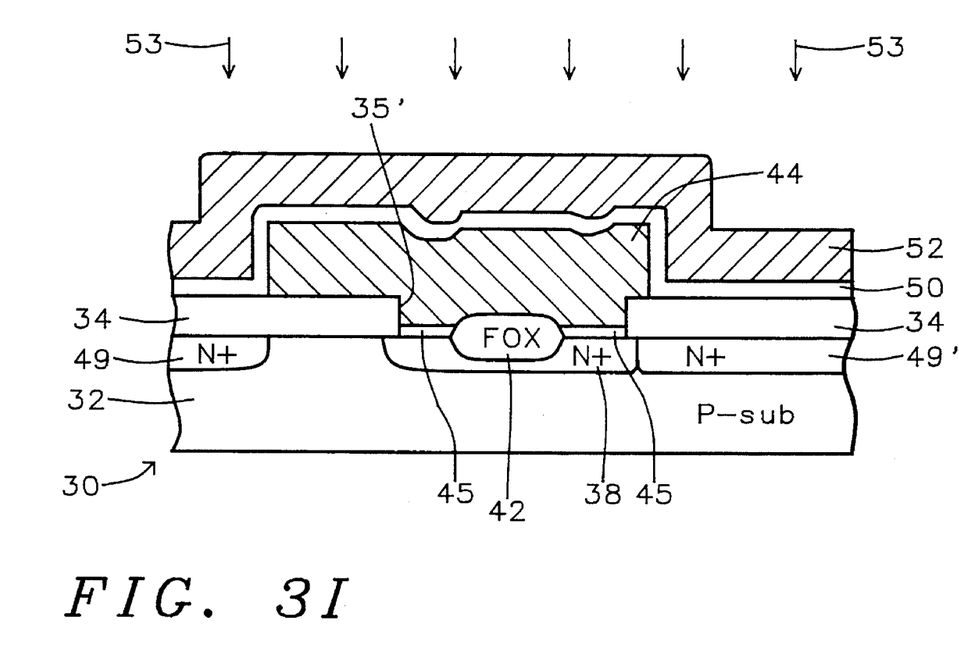
FIG. 3I shows the product of FIG. 3H after the formation of a conventional dielectric interpolysilicon sandwich in the form of a thin film ONO layer followed by deposition of a polysilicon 2 or a polycide control gate layer.

Referring to FIG. 3I, the product of FIG. 3H is shown after the formation of a conventional dielectric interpolysilicon sandwich in the form of a thin film 50, e.g. ONO (Silicon Oxide:Silicon Nitride:Silicon Oxide, with an effective thickness of ONO preferably of about 200Å applied to the exposed surfaces of the device of FIG. 3I by means of the conventional process.

Polysilicon 2 or Polycide Deposition and Doping

Then a polysilicon 2 or a polycide layer 52 is deposited. In the case of polysilicon 2, layer 52 is deposited to a range of thicknesses between about 2,000Å and about 5,000Å by the conventional LPCVD (low pressure chemical vapor deposition) process.

In the case of use of polysilicon 2, layer 52 is doped with a conventional process of blanket diffusion of a dopant of phosphoryl chloride (POCl$_3$) at 900° C. for 20 minutes. Alternatively, arsenic (As) dopant 53 is implanted by ion implantation with a dose within a range between about $1\times10^{15}$/cm$^2$ and about $1\times10^{16}$/cm$^2$ within a range of energies between about 50 keV and about 100 keV.

When layer 52 is formed of polycide it is composed of a material selected from the group consisting of WSi$_2$, TiSi$_2$, CoSi$_2$, MoSi$_2$, and TaSi$_2$.

Control Gate (Word Line) Masking and Etching

Figure 3J:
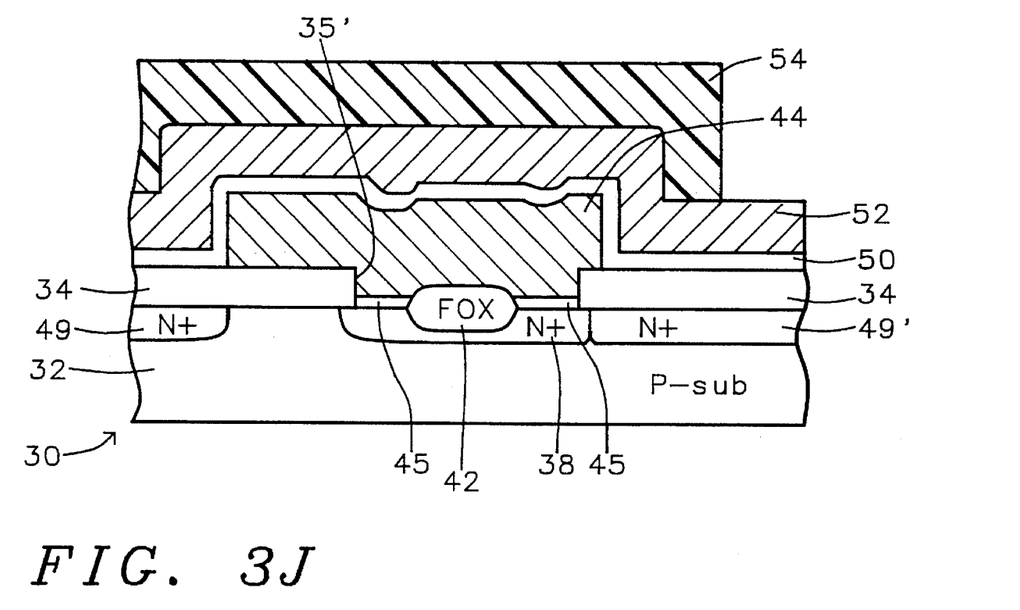
FIG. 3J shows the product of FIG. 3I after the formation of a mask patterned in the form of word lines and control gates in the conventional manner followed by etching.
Figure 3K:
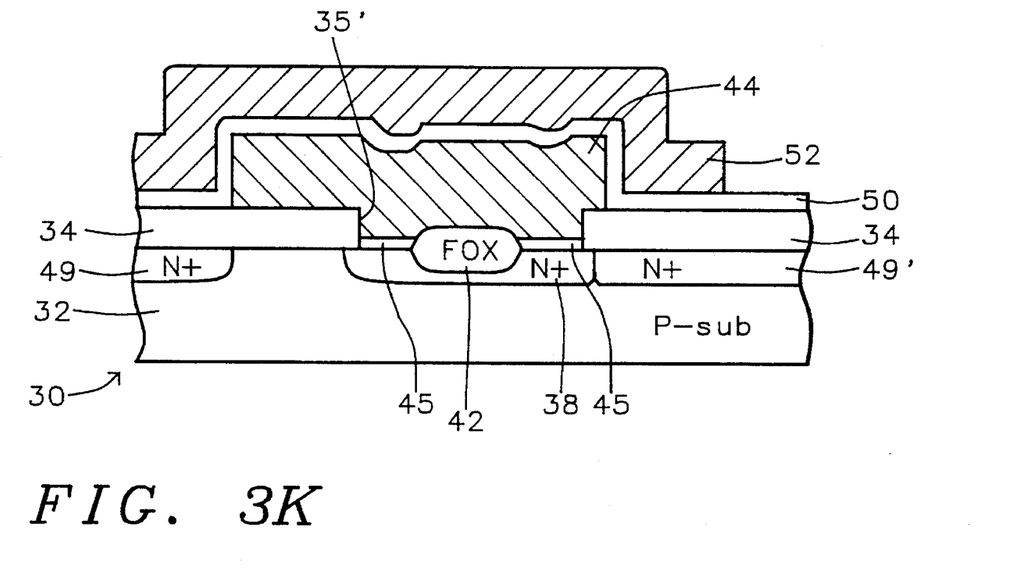
FIG. 3K shows the product of FIG. 3J, after the step of removing the mask added in FIG. 3J.

Referring to FIG. 3J, a mask layer 54 is formed over polysilicon 2 layer 52. Mask 54 is patterned in the form of word lines and control gates in the conventional manner.

Then the polysilicon 2 layer 52 is etched accordingly using a conventional etchant and the mask 54 to pattern the polysilicon 2 layer 52.

Back End Process

Conventional back end process steps follow including depositions of a glass (BPSG) layer, flow, contact formation, metallization and passivation.

Operation of Device

The programming and erase functions are performed using Fowler-Nordheim (F-N) tunnelling through the tunnel oxide layer 45.

When a suitable potential is applied to control gate (polysilicon 2) 52 while grounding the S/D regions 49, 49', electrons are injected into the floating gate 44 through the small tunnel oxide area 45 by the F-N tunneling effect. On the other hand, when the high voltage is applied to the S/D Junction while grounding the control gate 44, the electrons will be tunneled from the floating gate 44 to the source/drain regions 49, 49' by F-N tunneling.

This invention is adapted for use in EEPROM memory devices and in Flash EEPROM memory devices.

While this invention has been described in terms of the above specific embodiment(s), those skilled in the art will recognize that the invention can be practiced with modifications within the spirit and scope of the appended claims, i.e. that changes can be made in form and detail, without departing from the spirit and scope of the invention. Accordingly all such changes come within the purview of the present invention and the invention encompasses the subject matter of the claims which follow.

Having thus described the invention, what is claimed as new and desirable to be secured by Letters Patent is as follows:

1. A method of fabricating an EPROM on a lightly doped semiconductor substrate comprising, forming a first dielectric layer on said substrate, forming a tunnel mask with a tunnel opening therein, etching through said mask to form a tunnel window in said first dielectric layer, doping to form a first doped region of said substrate through said tunnel window, stripping said tunnel mask, forming a spacer frame about the periphery of said window over said first doped region of said substrate, forming a second dielectric layer over said first doped region within said spacer frame, removing said spacer frame, forming a tunnel oxide layer over the exposed surface of said first doped region of said substrate, forming a blanket deposit of a doped floating gate layer over said tunnel oxide layer, forming a floating gate mask over said floating gate layer and etching to shape said floating gate layer into a floating gate and then stripping said floating gate mask, ion implanting dopant to form buried N+ source/drain regions in said substrate through exposed surfaces of said gate oxide adjacent to said floating gate, forming a blanket interconductor layer over said floating gate, forming a blanket control gate layer of a doped material over said interconductor dielectric layer, forming a control gate mask on said control gate layer, patterning said control gate layer by etching away portions of said control gate layer unprotected by said control gate mask, and removing said control gate mask.

2. A method in accordance with claim 1 wherein said spacers are formed from silicon nitride.

3. A method in accordance with claim 2 wherein said spacers have a thickness of about 2000Å.

4. A method in accordance with claim 1 wherein said tunnel oxide has a thickness between about 200Å and about 500Å.

5. A method in accordance with claim 1 wherein said floating gate comprises a polysilicon layer having a thickness between about 1000Å and about 4000Å.

6. A method in accordance with claim 1 wherein said control gate layer comprises a doped layer of a material selected from the group consisting of polysilicon and polycide and having a thickness between 2000Å and about 5000Å.

7. A method in accordance with claim 1 wherein said first doped region is doped with an ion selected from the group consisting of arsenic and phosphorus at an energy between about 50 keV and about 100 keV implanted with a dose between about $1\times10^{14}/cm^2$ and about $8\times10^{14}/cm^2$.

8. A method in accordance with claim 1 wherein said second dielectric layer comprises silicon dioxide.

9. A method in accordance with claim 8 wherein said second dielectric layer has a thickness between about 200Å and about 500Å.

10. A method in accordance with claim 3 wherein said tunnel oxide has a thickness between about 200Å and about 500Å.

11. A method in accordance with claim 10 wherein said floating gate comprises a polysllicon layer having a thickness between about 1000Å and about 4000Å.

12. A method in accordance with claim 11 wherein said second polysilicon layer has a thickness between about 2000Å and about 5000Å.

13. A method in accordance with claim 10 wherein said first doped region is doped with an ion selected from the group consisting of arsenic and phosphorus at an energy between about 50 keV and about 100 keV implanted with a dose between about $1\times10^{14}/cm^2$ and about $8\times10^{14}/cm^2$.

14. A method in accordance with claim 13 wherein said second dielectric layer comprises silicon dioxide.

15. A method in accordance with claim 14 wherein said second dielectric layer has a thickness between about 200Å and about 500Å.

16. A method in accordance with claim 1 wherein said source/drain regions are ion implanted with arsenic at an energy between about 50 keV and about 80 keV implanted with a dose between about $1\times10^{15}/cm^2$ and about $5\times10^{15}/cm^2$.

17. A method in accordance with claim 13 wherein said source/drain regions are ion implanted with arsenic at an energy between about 50 keV and about 80 keV implanted with a dose between about $1\times10^{15}/cm^2$ and about $5\times10^{15}/cm^2$.

18. A method in accordance with claim 15 wherein said source/drain regions are ion implanted with arsenic at an energy between about 50 keV and about 80 keV implanted with a dose between about $1\times10^{15}/cm^2$ and about $5\times10^{15}/cm^2$.

19. A method of fabricating an EPROM on a lightly doped semiconductor substrate comprising, forming a gate oxide layer on said substrate, forming a tunnel mask with a tunnel opening therein over said gate oxide layer, etching through said mask to form a tunnel window in said gate oxide layer, doping to form a first doped region of said substrate through said tunnel window with an ion selected from the group consisting of arsenic and phosphorus at an energy between about 50 keV and about 100 keV implanted with a dose between about $1 \times 10^{14}/cm^2$ and about $8 \times 10^{14}/cm^2$, stripping said tunnel mask, depositing a a silicon nitride ($Si_3N_4$) spacer layer having a thickness between about 500Å and about 3000Å, said spacer layer shaped into a spacer frame so as to remain only about the periphery of said window over said first doped region of said substrate by means of an anisotropic etch back, forming a silicon dioxide layer having a thickness between about 200Å and about 500Å over said first doped region within said spacer frame, removing said spacer frame, forming a tunnel oxide layer having a thickness between about 200Å and about 500Å over the exposed surface of said first doped region of said substrate, forming a blanket deposit of a doped floating gate layer over said tunnel oxide layer, forming a floating gate mask over said floating gate layer and etching to shape said floating gate layer into a floating gate and stripping said mask, ion implanting dopant to form buried N+ source/drain regions in said substrate through exposed surfaces of said gate oxide adjacent to said floating gate, said source/drain regions being ion implanted with arsenic at an energy between about 50 keV and about 80 keV implanted with a dose between about $1 \times 10^{15}/cm^2$ and about $5 \times 10^{15}/cm^2$, forming a blanket ONO interconductor layer over said floating gate, forming a blanket control gate layer of a doped material over said interconductor dielectric layer, forming a control gate mask on said control gate layer, patterning said control gate layer by etching away portions of said control gate layer unprotected by said control gate mask, and removing said control gate mask.

20. A method in accordance with claim 19 wherein said floating gate layer comprises a polysilicon layer having a thickness between about 1000Å and about 4000Å.

21. A method in accordance with claim 20 wherein said control gate layer comprises a doped layer of a material selected from the group consisting of polysilicon and polycide having a thickness between 2000Å and about 5000Å.

* * * * *